(12) United States Patent
Healy et al.

(10) Patent No.: US 10,979,062 B2
(45) Date of Patent: Apr. 13, 2021

(54) DATA ACQUISITION SYSTEM-IN-PACKAGE

(71) Applicant: Analog Devices International Unlimited Company, Limerick (IE)

(72) Inventors: John P. Healy, Rochestown (IE); Michael Hennessy, Dooradoyle (IE); Naiqian Ren, Limerick (IE); Patrick Martin McGuinness, Pallaskenry (IE); Robert A. Bombara, Newton, MA (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/858,099

(22) Filed: Apr. 24, 2020

(65) Prior Publication Data

US 2020/0252074 A1 Aug. 6, 2020

Related U.S. Application Data

(62) Division of application No. 16/230,768, filed on Dec. 21, 2018, now Pat. No. 10,680,633.

(51) Int. Cl.
*H03M 1/12* (2006.01)
*H01L 23/00* (2006.01)
(Continued)

(52) U.S. Cl.
CPC .............. *H03M 1/12* (2013.01); *H01L 24/48* (2013.01); *H01L 25/16* (2013.01); *H03F 1/30* (2013.01);
(Continued)

(58) Field of Classification Search
CPC ......... H03M 1/12; H03M 3/458; H01L 24/48; H01L 25/16; H03F 1/30; H03F 3/45071
(Continued)

(56) References Cited

U.S. PATENT DOCUMENTS

| 4,528,637 A | 7/1985 | Smith |
| 7,180,403 B2 | 2/2007 | Quan |

(Continued)

FOREIGN PATENT DOCUMENTS

EP   1724833 A2   11/2006

OTHER PUBLICATIONS

"U.S. Appl. No. 16/230,768, 312 Amendment filed Feb. 5, 2020", 7 pgs.

(Continued)

*Primary Examiner* — Brian K Young
(74) *Attorney, Agent, or Firm* — Schwegman Lundberg & Woessner, P.A.

(57) ABSTRACT

This disclosure describes techniques to perform analog signal conditioning (including filtering and amplification) and analog-to-digital conversion (ADC) on a System-in-package (SIP) assembly technology. In particular, the disclosure combines a programmable gain amplifier (PGA), one or more filter circuits, and an ADC circuit onto the same SIP. These devices are coupled together on the SIP using high-accuracy and precise integrated-passive components. The SIP receives an analog signal, amplifies the analog signal with the PGA on the SIP, filters the amplified analog signal with the filter circuit(s) on the SIP, and then performs analog-to-digital conversion on the filtered amplified analog signal with the ADC circuit on the SIP. The SIP can be configured for various applications based on a variety of inputs and control mechanisms.

19 Claims, 12 Drawing Sheets

(51) Int. Cl.
*H01L 25/16* (2006.01)
*H03F 1/30* (2006.01)
*H03F 3/45* (2006.01)
*H03M 3/00* (2006.01)
*H03H 11/04* (2006.01)

(52) U.S. Cl.
CPC ........ *H03F 3/45071* (2013.01); *H03M 3/458* (2013.01); *H01L 2924/19015* (2013.01); *H01L 2924/19041* (2013.01); *H01L 2924/19043* (2013.01); *H03F 2200/129* (2013.01); *H03F 2200/165* (2013.01); *H03F 2200/171* (2013.01); *H03F 2203/45116* (2013.01); *H03F 2203/45528* (2013.01); *H03H 11/04* (2013.01)

(58) Field of Classification Search
USPC ........................................................ 341/155
See application file for complete search history.

(56) References Cited

U.S. PATENT DOCUMENTS

| | | | |
|---|---|---|---|
| 7,227,489 B2 | 6/2007 | Tryggvason et al. | |
| 7,896,807 B2 | 3/2011 | Clancy et al. | |
| 9,083,369 B2 | 7/2015 | Coln et al. | |
| 9,112,524 B2 | 8/2015 | Snelgrove | |
| 9,584,089 B2 * | 2/2017 | Chen ................... | H03H 17/0273 |
| 9,589,625 B2 * | 3/2017 | Kim ..................... | G11C 11/4091 |
| 10,665,534 B2 * | 5/2020 | Lee ....................... | H01L 21/561 |
| 10,680,633 B1 | 6/2020 | Healy et al. | |
| 10,700,011 B2 * | 6/2020 | Yang ................... | H01L 21/4853 |
| 10,756,056 B2 * | 8/2020 | Liu ................... | H01L 21/76898 |
| 2020/0204185 A1 | 6/2020 | Healy et al. | |

OTHER PUBLICATIONS

"U.S. Appl. No. 16/230,768, Notice of Allowance dated Jan. 29, 2020", 9 pgs.

"U.S. Appl. No. 16/230,768, PTO Response to Rule 312 Communication dated Mar. 23, 2020", 2 pgs.

U.S. Appl. No. 16/230,768, filed Dec. 21, 2018, Data Acquisition System-In-Package.

"European Application Serial No. 19213612.5, Extended European Search Report dated May 29, 2020", 13 pgs.

"Integrated Passive Devices—Wikipedia", Retrieved from the Internet: <URL: https://en.wikipedia.org/w/index.phd?title=Integrated_passive_devices&oldid=828252941>, [Retrieved by the examiner on Apr. 28, 2020], (Mar. 2018), 2 pgs.

Maxim, Adrian, et al., "A Fully Integrated 0.13 CMOS Low-IF DBS Satellite Tuner Using Automatic Signal-Path Gain and Bandwidth Calibration", IEEE Journal of Solid-State Circuits, IEEE, USA, vol. 42, No. 4, (Apr. 2007), 897-921.

* cited by examiner

DATA ACQUISITION SYSTEM-IN-PACKAGE

CLAIM OF PRIORITY

This application claims the benefit of priority and is a division of U.S. patent application Ser. No. 16/230,768, filed Dec. 21, 2018, which is hereby incorporated by reference herein in its entirety.

FIELD OF THE DISCLOSURE

This document pertains generally, but not by way of limitation, to a system-in-package (SIP) data acquisition device, and more particularly, to analog-to-digital converter (ADC) circuits and systems.

BACKGROUND

In many electronics applications, an analog input signal is converted to a digital output signal (e.g., for further digital signal processing). For instance, in measurement systems, electronics are provided with one or more sensors to make measurements, and these sensors can generate an analog signal. The analog signal can then be provided to an ADC circuit as input to generate a digital output signal for further processing. In another instance, in a mobile-device receiver, an antenna can generate an analog signal based on the electromagnetic waves carrying information/signals in the air. The analog signal generated by the antenna can then be provided as input to an ADC to generate a digital output signal for further processing.

Typical systems amplify and filter the analog signals using discrete physical components coupled together on a printed circuit board prior to performing ADC using another circuit component. Variations amongst these discrete components are typically accounted for using various passive components which further introduce noise and inefficiencies, and consume board space. As a result, combining all of these discrete components on a printed circuit board to perform ADC limits the system versatility and performance reliability, increases manufacturing complexity and costs, and consumes a large amount of physical board space.

SUMMARY OF THE DISCLOSURE

This disclosure describes techniques to perform analog signal conditioning (including filtering and amplification) and analog-to-digital conversion (ADC) on a system-in-package (SIP). In particular, the disclosure combines a programmable gain amplifier (PGA), one or more filter circuits, and an ADC circuit onto the same SIP. These devices are coupled together on the SIP using high-accuracy and precise integrated-passive components. The SIP receives an analog signal, amplifies the analog signal with the PGA on the SIP, filters the amplified analog signal with the filter circuit(s) on the SIP, and then performs analog-to-digital conversion on the filtered amplified analog signal with the ADC circuit on the SIP. The SIP can be configured for various applications based on a variety of inputs and control mechanisms.

In some certain embodiments, a data acquisition System-in package (SIP) assembly technology is provided. The SIP comprising an amplifier, enclosed on the SIP, configured to receive an analog input signal and to generate an amplified analog input signal. The SIP further comprising a filter, enclosed on the SIP, coupled to the amplifier via one or more wires bonded within the SIP, configured to filter the amplified analog input signal. The SIP further comprising a resistor network, enclosed on the SIP and coupled to the amplifier and the filter, configured to offset a resistance of the one or more wires across a range of temperatures. The SIP further comprising an analog-to-digital converter (ADC), enclosed on the SIP, coupled to the filter via one or more wires bonded within the SIP, configured to generate a digital representation of the filtered amplified analog input signal.

In some implementations, the amplifier comprises first and second programmable gain amplifiers, wherein the analog input signal comprises a differential input signal, and wherein the filter comprises a $N^{th}$ order anti-alias filter. In some implementations, the amplifier receives the analog input signal from pre-filter circuitry external to the SIP.

In some implementations, the SIP further comprises pre-filter circuitry configured to pre-filter the analog input signal before the analog input signal is received by the amplifier. In some implementations, the SIP further comprises a set of integrated-passive components, wherein the amplifier, the filter, and the ADC are coupled through the set of integrated-passive components. In some implementations, the integrated-passive components comprise a thin-film resistor network and a capacitor network.

In some implementations, a die is provided that corresponds to at least one of the amplifier, the filter and the ADC and includes a first integrated circuit manufactured according to a first fabrication process and a die is provided that corresponds to at least another one of the amplifier, the filter and the ADC and includes a second integrated circuit manufactured according to a second fabrication process different from the first fabrication process. In some implementations, the first and second fabrication processes comprises different technologies including at least one of low voltage MOS, high voltage MOS, low voltage DMOS, high voltage DMOS, low voltage bipolar, high voltage bipolar, high speed bipolar, BiCMOS, JFET, silicon germanium, silicon carbide, gallium nitride, gallium arsenide, gallium nitride on silicon carbide, gallium nitride on silicon, or silicon on insulator.

In some implementations, the SIP is a land grid array (LGA), a ball grid array (BGA), or pin grid array (PGA) package.

In some certain embodiments, a method for performing data acquisition with a System-in-package (SIP) assembly technology is provided. The method comprises: receiving, with an amplifier (PGA) enclosed on the SIP, an analog input signal to generate an amplified analog input signal; filtering the amplified analog input signal with a filter, enclosed on the SIP, coupled to the amplifier via one or more wires bonded within the SIP; offsetting a resistance of the one or more wires across a range of temperatures with a resistor network, enclosed on the SIP and coupled to the amplifier and the filter; and generating, with an analog-to-digital converter (ADC) enclosed on the SIP, a digital representation of the filtered amplified analog input signal.

In some implementations, the analog input signal comprises a differential input signal, wherein the filter comprises a $N^{th}$ order anti-alias filter, and wherein the amplifier comprises first and second programmable gain amplifiers. In some implementations, the method comprises pre-filtering, with pre-filter circuitry external to the SIP, a given analog signal to generate the analog input signal. In some implementations, the method comprises pre-filtering, with pre-filter circuitry enclosed on the SIP, the analog input signal before the analog input signal is received by the amplifier. In some implementations, the amplifier, the filter, and the ADC are coupled through a set of integrated-passive components enclosed on the SIP. In some implementations, the integrated-passive components comprise a thin-film resistor network and a capacitor network.

This overview is intended to provide an overview of subject matter of the present patent application. It is not intended to provide an exclusive or exhaustive explanation of the inventive subject matter. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
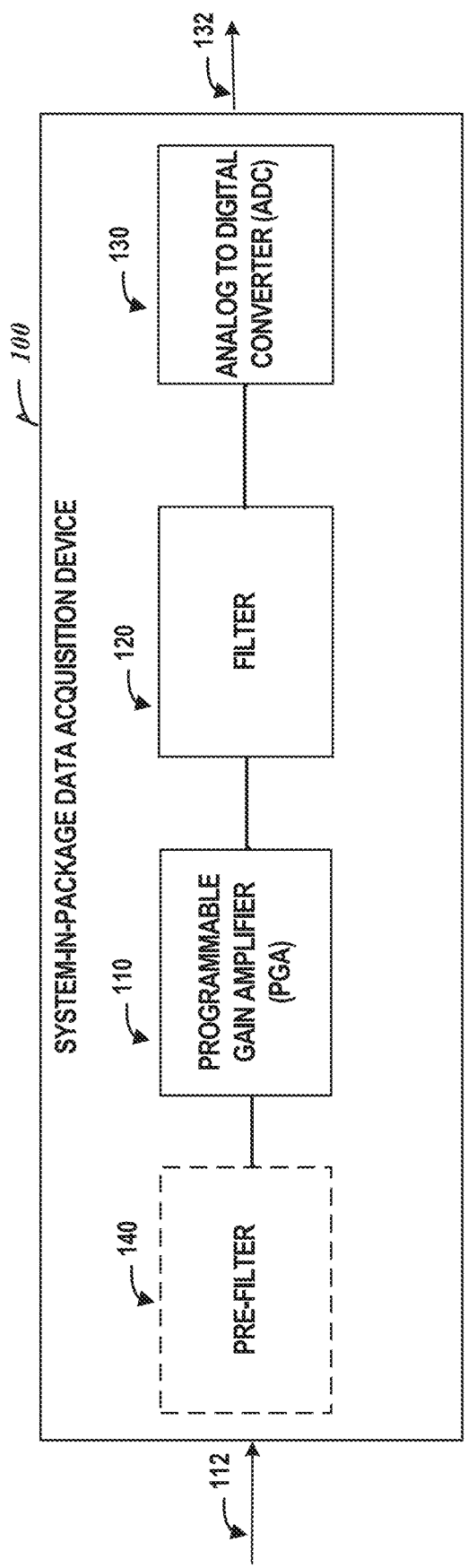
FIG. 1 is a block diagram of an example of a SIP data acquisition device in accordance with various embodiments.

A system-in-package (SIP) or system-in-a-package is a physical component manufactured with a number of integrated circuits enclosed in a single module (package). Dies containing integrated circuits may be stacked vertically on a substrate. They are internally connected by fine wires that are bonded to the package. Alternatively, with a flip-chip technology, solder bumps are used to join stacked chips together. SIP dies can be stacked vertically or tiled horizontally, unlike slightly less dense multi-chip modules, which place dies horizontally on a carrier. This means that a complete functional unit can be built in a multi-chip package, so that fewer external components are used to make the functional unit work.

This disclosure describes, among other things, techniques to perform analog signal conditioning (including filtering and amplification) and analog-to-digital conversion (ADC) on a system-in-package (SIP). In particular, the disclosure combines a programmable gain amplifier (PGA), one or more filter circuits, and an ADC circuit onto the same SIP. These devices are coupled together on the SIP using high-accuracy and precise integrated-passive components. The SIP receives an analog signal, amplifies the analog signal with the PGA on the SIP, filters the amplified analog signal with the filter circuit(s) on the SIP, and then performs analog-to-digital conversion on the filtered amplified analog signal with the ADC circuit on the SIP. The SIP can be configured for various applications based on a variety of inputs and control mechanisms.

Advantages of the SIP data acquisition system techniques of this disclosure include improved signal specifications, less physical board space, lighter system weight, less part-to-part variation, improved gain/phase drift, and a wider range of applicability than traditional data acquisition systems constructed using discrete physical components on a printed circuit board. In particular, typical data acquisition systems, designed based on off-the-shelf discrete physical components, exhibit wide tolerances (e.g., signal gain drift and matching) from one discrete physical component to another, making them more complex to design and limiting their applicability from one type of sensor to another. Such physical components are generally large and heavy, (relative to modern fine geometry integrated circuit fabrication processes) and detailed knowledge of each component's performance is needed to properly design the data acquisition system. In addition, masking the design details from the outside world becomes difficult, because the typical data acquisition system's discrete physical components are coupled together on a printed circuit board.

According to the described techniques, the data acquisition system takes into account, at device manufacture, the specifications of various data acquisition system devices (e.g., PGA, filters, ADC, and passive components) to produce a single data acquisition SIP that is lightweight and robust, and has improved performance over typical data acquisition systems. Providing such a data acquisition system on a SIP, according to the described embodiments, reduces the design complexity exhibited by traditional systems for processing analog signals from various sensors and improves system reliability.

FIG. 1 is a block diagram of an example of a SIP data acquisition device 100 in accordance with various embodiments. The SIP data acquisition device 100 includes a PGA 110, a filter 120, and an ADC 130. While a PGA 110 is shown as being implemented in the SIP data acquisition device 100, any other type of amplifier or device can be used in place of or in addition to the PGA 110. For example, the PGA 110 may be replaced by or coupled to any device that receives, monitors, and/or senses an input signal to allow subsequent signal conditioning, amplification, attenuation, or filtering in order to present a conditioned input signal for the filter 120 and/or ADC 130 to interpret. This allows the ADC 130 to accurately and precisely digitally encode the received analog signal without causing unnecessary loading and/or burden on the received sensor signal.

The SIP data acquisition device 100 also includes an integrated-passive components network (e.g., an integrated-passive resistor and capacitor network) (not shown). In some implementations, the SIP data acquisition device 100 may include a pre-filter 140. The SIP data acquisition device 100 receives an analog signal 112, which may be a differential signal or a single input signal. The signal 112 may be an AC or DC signal. Although only one differential or single input signal 112 is shown in FIG. 1, any number of additional differential or single input signals may be received and processed in parallel by the SIP data acquisition device 100.

Each component of the SIP data acquisition device 100 may be implemented and manufactured together on the same system-in-package and interconnected with one or more wires bonded to the SIP. The system-in-package may be a land grid array (LGA), a ball grid array (BGA), or a pin grid array (PGA) package. The footprint (size) of the SIP data acquisition device 100 may be substantially smaller than that of traditional data acquisition systems. In particular, the footprint of the SIP data acquisition device 100 may be 6 mm×12 mm.

The PGA 110 includes circuitry that implements an amplifier to apply gain to the received analog input signal 112. The PGA 110 may be externally controlled to apply different gains (e.g., by adjusting which one or more integrated-passive resistors are coupled to the PGA 110). For example, a multiplexor (not shown) may be coupled to an input of the PGA 110. The multiplexor may have inputs coupled to an integrated-passive resistor network such that the select input to the multiplexor causes different voltage values from the integrated-passive resistor network to be output and applied to the PGA 110 input. This select input to the multiplexor may be controlled by an external component (e.g., a microprocessor or control circuitry) depending on the given application or sensor being monitored.

For example, the PGA 110 may receive the analog input signal 112 (e.g., from a sensor or some other external component) and may apply gain to the signal 112. In some implementations, the PGA 110 may receive the analog input signal 112 after the signal 112 passes through the pre-filter 140. In implementations, where the SIP data acquisition device 100 does not implement the pre-filter 140, similar pre-filter circuitry may be implemented off-chip by an external component. This external pre-filter circuitry filters a given analog signal and provides the pre-filtered analog signal as the analog signal 112. The PGA 110 may allow gain/attenuation of small sensor output signals in the presence of large common-mode signals. In some implementations, the PGA 110 may be a high-impedance, low-noise/drift amplifier circuit.

After being amplified by the PGA 110, the amplified analog input signal is provided to the filter 120. The filter 120 may include an $N^{th}$-order anti-alias filter circuit (e.g., a first-, second-, third-, or fourth-order anti-alias filter). The filter 120 conditions the received signal to remove or reduce unwanted components. For example, the filter 120 may remove noise components from the amplified analog input signal. The filter 120 may minimize or remove out-of-band signal interferences. The filter 120 may adjust the signal amplitude range of the amplified analog input signal to an optimum level for measurement by the ADC 130. In general, the filter 120 implements any suitable circuitry to improve the quality of the analog signal that will be sampled by the ADC 130.

One of the challenges in incorporating the components of the SIP data acquisition device 100 into a SIP module relates to managing part-to-part phase lag matching and phase-lag tracking across a range of temperatures. Specifically, a particular challenge in the processing of real-world analog signals in a data acquisition channel is the preservation of the DC and AC characteristics of the analog input signal, when taken from multiple input sources (e.g., from the outputs of a strain gauge, a vibration sensor, accelerometer or temperature RTD, or thermocouple sensors). Examples of important DC and AC characteristics are signal amplitude, frequency or spectral content, and preservation of phase or timing relationships with respect to other signals. These signals may be physically located at or received from sites close to or far from each other and experience different environments (e.g., noise and temperature supply fluctuations).

For example, for dynamic signal analysis, the outputs of orthogonal X and Y sensors are combined to give a resultant analog signal for each bearing encased cylindrically around a rotating rotor shaft. The resultant magnitude and phase angle for each bearing are found using the following vector equations:

$$\text{Magnitude(Volts)}|V| = \sqrt{X^2 + Y^2}$$

$$\text{Phase(Degrees)} V = \arctan\left(\frac{Y}{X}\right)$$

Figure 7:
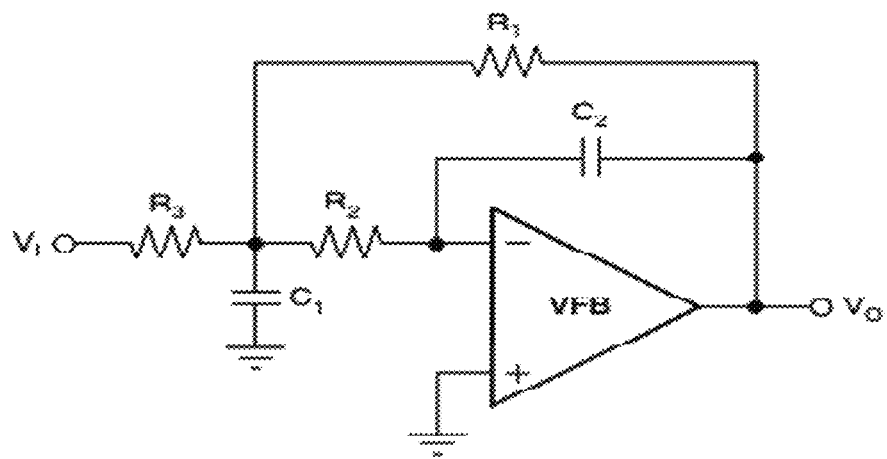
FIG. 7 shows an illustrative topology of a low-pass anti-alias filter in accordance with various embodiments.

Maintaining the correct magnitude (amplitude) and phase-angle information of the X and Y sensor outputs in the presence of drifting temperature, voltage, and aging is important. FIG. 7 shows an illustrative topology of a second-order low-pass anti-alias filter 700 that can be implemented by the filter 120 for managing part-to-part phase-lag matching and phase-lag tracking across a range of temperatures to, for example, maintain the correct magnitude (amplitude) and phase-angle information of the X and Y sensor outputs in the presence of drifting temperature, voltage, and time.

The DC and AC signal characteristics of the filter 700 can be represented by the following equations:

$$\text{Transfer Function } H(s) = \frac{Wo^2}{S^2 + Wo/Q + Wo^2} \quad (1)$$

$$\text{DC Gain} = -R1/R3 (V/V): \text{Magnitude(Amplitude)Response} \quad (2)$$

3dB Cutoff $Freq\ Wo =$ \hfill (3)

$$\frac{1}{\sqrt{R1R2C1C2}} \text{(radians): Magnitude \& Phase Response}$$

$$\text{Filter } Q \text{ Factor} = \frac{R3 * \sqrt{\frac{C1}{C2}}}{\sqrt{R1/R2} + \sqrt{R2/R1} + \sqrt{(R1*R2)/R3}}; \quad (4)$$

Magnitude & Phase Response.

$$\text{Or } Q \text{ Factor} = \frac{R3 * \sqrt{\frac{C_1}{C_2}}}{R2\sqrt{\alpha} + R3\left(\sqrt{\alpha} + \frac{1}{\sqrt{\alpha}}\right)}, \alpha = R1/R2; \text{ (unitless)}$$

The "filter Q" factor (Equation 4) refers to the quality factor of the filter 700, which is used to determine the type of desired filter characteristic. In some implementations, the applications with a particular response (e.g., Bessel response) are first optimized to maintain a linear phase vs. frequency response across all frequencies from DC-100 kHz, while minimizing the variation in magnitude response across the signal passband. Maintaining a linear phase response preserves frequency harmonic relationships of a signal, without introducing frequency distortion, as all frequency components of the input signal are shifted by the same (constant) time amount when converted from a continuous time-varying signal to a discrete sampled-in time signal by action of A/D conversion. A fixed time delay may not alter the frequency characteristics of the measured signal.

To preserve the DC and AC characteristics of the filter 700 may require consideration of the DC gain accuracy and drift and the AC response. From Equation 2, preserving the DC gain accuracy and drift can be achieved using accurate ratios of unit resistors R1:R3, where absolute tolerance in the values of R1 and R3 is not conditional. From Equations 3 and 4, preserving the AC response can be achieved by providing high-precision R1, R2, R3 and C1, C2 component values to define the frequency cutoff Wo and quality factor Q accurately. Namely, to preserve the DC and AC magnitude and phase characteristics across a range of temperatures/voltages may require the implementation of the filter 700 using high-accuracy and high-stability passive resistors and capacitors with extremely low voltage and temperature coefficients.

Such accuracy and stability can be achieved, according to some embodiments, by fabricating integrated-passive components, such as by using a SiCr Thin Film Resistor fabrication technology, where a temperature coefficient of resistance (TCR or TC) is less than approximately −25 ppm/° C., where manufacturable tolerances are +/−0.05% or less depending on laser trim time. Similarly, such capacitor accuracy and stability can be achieved using ultra temperature-stable COG/(NP0) ceramic capacitors with a TCR of order +/−30 ppm/° C. Interconnecting these integrated components (iPassive devices) is not trivial in that metal tracing (wires) in silicon wafers (e.g., aluminium or copper) is used, which itself has certain resistive values that need to be considered and accounted for to provide the desired accuracy and stability across a range of temperatures.

To address, compensate for, or offset the resistive value of the traces or wires, in one embodiment, the TC of the wire itself is considered. For example, the TC of aluminium or copper may be approximately +3800 ppm/° C., which is a positive value, whereas the TCR of SiCr Thin Film Resistors is a negative value of approximately −25 ppm/° C. In this way, the total ratio R1:R3 can be maintained constant across all temperatures or a particular range of temperatures by ensuring that the metal resistance in series with SiCr resistor R1 relative to the metal resistance in series with SiCr resistor R3 follows the same ratio R1:R3. The end result means that the ratio (R1Metal+R1) to (R3Metal+R3) is equal to the ratio R1:R3 regardless of the temperature.

Additional aluminium or copper interconnectivity can be included to compensate for the product of resistance and capacitance (e.g., R*C drift) and to minimize the filter 3 dB frequency and Q factor drift. Specifically, as the TC of the resistors and capacitors is predetermined, or is of a measurable quantity, it is possible to utilize their respective drift values to give overall temperature stability of the product of resistance multiplied by capacitance the R*C product). This can be useful for maintaining stability and predictability of the signal chain AC phase characteristic and device-to-device matching.

Such compensation to maintain stability and predictability across a range of temperatures and voltages is not achievable by interconnecting discrete components, particularly because their resistive and capacitive qualities are predetermined, change greatly over a range of temperatures and voltages, and highly depend on their physical board layout locations. Also, the resistive values of wires interconnecting such discrete components are difficult to determine ahead of time before assembling the DAQ data acquisition (DAQ) system into the application. Further, even after assembling the DAQ into the application, temperatures can vary, which, as shown above, influences the measurement precision of the DAQ. By employing SIP fabrication techniques, the predictability, repeatability, and close proximity of resistors and capacitors, on a shared substrate, encapsulated in a package, with defined temperature gradients can be accounted for at the time of manufacture to offset and cancel temperature drift effects that arise during application of the DAQ.

For example, using integrated-passive components (e.g., using iPassive techniques), the unwanted metal interconnect resistance can be offset and compensated for throughout the SIP data acquisition device 100. Namely, all or a subset of the interconnections between resistors, capacitors, modules, and other components in the SIP data acquisition device 100 can be considered at device manufacture and offset using additional interconnections and/or resistors. Specifically, a parasitic interconnect of value $\Delta R$ ohms ($\Omega$) may arise at all interconnect nodes, which causes a series resistor R1 to become in effect R1+$\Delta R\Omega$. This unwanted interconnect, together with laser trimming techniques, allows the setting of an arbitrary target value for each of the resistors (e.g., any resistor used on the SIP data acquisition device 100 or other devices that are shown and described) to account for the parasitic routing resistance $\Delta R\Omega$ at each network node to remove the unwanted increase in nominal resistance while allowing a change in the temperature characteristic to exist after laser trimming.

For the resistor R1, assuming a parasitic resistance $\Delta R1$ exists across the terminals, the pre-laser trimming value can be represented by (R1+$\Delta R1$)$\Omega$, and the post-laser trimming value can be represented by (R1−$\Delta R1$)+$\Delta R1$=R1 (to desired accuracy), where a resistance of R1=(a. TCR film resistivity)+(b. aluminum resistivity); a sum (a+b)=1; and the new TCR can be represented by new TCR (ppm/° C.)=a*(R1−$\Delta R1$)*(−25 ppm/° C.)+b*$\Delta R1$*(+3800 ppm/° C.). Values for the fractions or coefficients a and b are selected to achieve a desired TCR slope of R1 to cancel the TC slope of a capacitor and to minimize the temperature drift effects of the system.

Referring back to FIG. 1, after being filtered by the filter 120, the filtered amplified analog input signal is provided to the ADC 130. The ADC 130 includes any suitable analog-to-digital conversion circuitry for generating a digital representation (signal) of the analog input signal. For example, the ADC 130 may implement a successive approximation (SAR) analog-to-digital conversion circuit, a discrete or continuous sigma delta analog-to-digital conversion circuit, a flash analog-to-digital conversion circuit, or a dual-slope analog-to-digital conversion circuit. The digital representation generated by the ADC 130 may be provided as digital output 132 of the SIP data acquisition device 100. The digital output 132 may be provided to an external component or host (e.g., a microprocessor or control circuitry) for digital processing.

In some embodiments, the ADC 130 includes an embedded temperature sensor. Alternatively, a laminate-based diode-based device can be incorporated into the SIP data acquisition device 100 and connected to the ADC 130 inputs using a multiplexer. This allows the total signal-chain temperature to be accurately monitored. As the temperature changes inside the SIP data acquisition device 100 (e.g., inside of the SIP), due to changes in operating speed, power, or ambient environments, a background calibration check can read the effective temperature rise. This temperature rise can be compared to the temperature change that resulted in prior calculations using a look-up table (LUT). Namely, the LUT can store the temperature that is monitored at each measurement, and an external or internal processor can continuously compare the prior temperatures with the current temperature reading by referencing the LUT to determine whether a temperature change exceeds a threshold (which may be set in a user-programmable register). If the threshold is exceeded, the processor can adjust one or more components of the SIP data acquisition device 100 by accessing one or more values stored in user-programmable registers.

This calibration is effective because the programmable gain amplifier, resistors, driver amplifier, and ADC 130 are encapsulated in a defined, closely controlled environment and benefit from the defined and repeatable thermal conductivity (gradient) of a shared package and laminate substrate which is not achievable by interconnecting discrete external components. Namely, interconnecting the components in a single SIP module avoids the disadvantages of connecting discrete external components, including larger separation between amplifiers, discrete resistors and capacitors, less control of temperature environments, differing temperature gradients across a printed circuit board, extensive use of lead-solder connectivity, and larger manufacturing tolerances.

In some implementations, a first portion of the components implemented on the SIP data acquisition device 100 may be fabricated using a first fabrication process (e.g., low-voltage MOS, high-voltage MOS, low-voltage DMOS, high-voltage DMOS, low-voltage bipolar, high-voltage bipolar, high-speed bipolar, BiCMOS, JFET, silicon germanium, silicon carbide, gallium nitride, gallium arsenide, gallium nitride on silicon carbide, gallium nitride on silicon, or silicon on insulator). A second portion of the components implemented on the SIP data acquisition device 100 may be fabricated using a second fabrication process (e.g., low-voltage MOS, high-voltage MOS, low-voltage DMOS, high-voltage DMOS, low-voltage bipolar, high-voltage bipolar, high-speed bipolar, BiCMOS, JFET, silicon germanium, silicon carbide, gallium nitride, gallium arsenide, gallium nitride on silicon carbide, gallium nitride on silicon, or silicon on insulator) different from the first fabrication process. For example, the PGA 110 may be implemented with low-voltage JFET devices and the ADC 130 may be implemented with CMOS devices.

Figure 2:
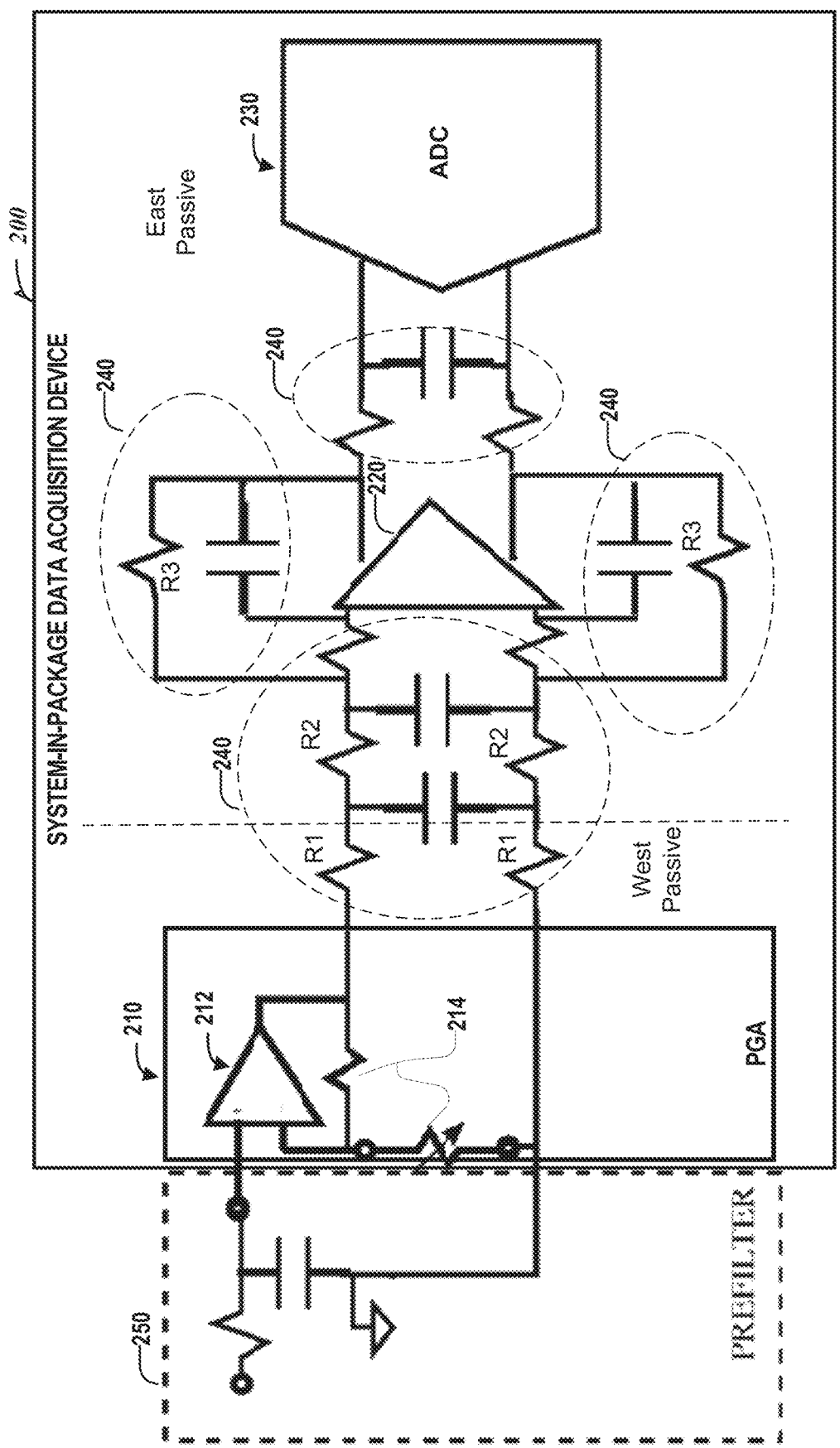
FIG. 2 is a block diagram of an example of a single-input SIP data acquisition device in accordance with various embodiments.

FIG. 2 is a block diagram of an example of a single-input SIP data acquisition device 200 in accordance with various embodiments. The SIP data acquisition device 200 represents an implementation of the SIP data acquisition device 100, and some or all of the components of the SIP data acquisition device 100 are included in the SIP data acquisition device 200 with similar functionality. The SIP data acquisition device 200 includes some of the devices from the SIP data acquisition device 100. For example, the SIP data acquisition device 200 includes a PGA 210, a filter 220, an ADC 230, and a series of integrated-passive devices (resistors and capacitors) 240 all implemented on the same SIP. The PGA 210 may include some or all of the circuitry of the PGA 110, the filter 220 may include some or all of the circuitry of the filter 120, and the ADC 230 may include some or all of the circuitry of the ADC 130.

The SIP data acquisition device 200 may be coupled to an externally implemented pre-filter 250. The pre-filter 250 may receive an analog signal, pre-filter the analog signal, and provide the pre-filtered analog signal to an input of the SIP data acquisition device 200. The pre-filter 250 may filter a signal using discrete physical passive components (resistors and capacitors) on a printed circuit board coupled to the SIP data acquisition device 200. The pre-filter 250 may implement a high-pass filter, low-pass filter, band-pass filter, or any other suitable filtering circuitry or combination thereof.

The components in the SIP data acquisition device 200 may be coupled together through the series of integrated-passive devices (resistors and capacitors) 240 via one or more wires that are bonded to or within the SIP. These integrated-passive devices may be fabricated using standard wafer fabrication techniques, such as thin-film and photolithography processing. The substrates for integrated-passive devices may be thin-film substrates such as silicon, alumina, or glass. For example, the integrated-passive resistors may be manufactured from high-accuracy thin-film silicon chromium (SiCr). The integrated-passive capacitors may be manufactured as metal-insulator-metal (MIM) capacitors.

Using such integrated-passive devices (components) (iPassive devices) provides a technological improvement over traditional systems that use discrete passive components in performing data acquisition. In particular, implementing integrated-passive devices in the SIP data acquisition device 200 enables superior gain matching and gain drift performance to that obtained with discrete passive components, and the part-to-part variations in integrated-passive devices are lower than those in discrete passive components that are typically used on a printed circuit board to implement a traditional data acquisition system.

To use the integrated-passive device, the die thin-film resistor pairing may need to be considered. Particularly, ideally, the thin-film resistors that form part or all of the series of integrated-passive devices 240 determine the DC and AC characteristics of various components (e.g., the filter 220) in the SIP data acquisition device 200. To maximize performance, these components are physically placed and assembled in close proximity on a single silicon die. This ensures unit-resistor to unit-resistor matching, which maintains the precision of the SIP data acquisition device 200 and minimizes the effects of X-axis or Y-axis cross-die temperature gradients. Namely, because the devices are physically close to each other, the temperatures of the various iPassive devices change by substantially equal amounts, which maintains the overall expected behavior profile of the device.

As mentioned above, slight variations in the TCR of iPassive (e.g., metal thin film resistor) components (e.g., SiCr) and in the aluminum or copper wiring interconnects between the components cause the overall TCR of the unit iPassive components (e.g., resistors) to differ slightly from unit to unit. In some embodiments, the sensitivity to TCR may be minimized by identifying and creating neighboring "east-" and "west-side" iPassive die pairs (e.g., as shown by "East Passive" and "West Passive" labels in FIG. 2). The TCR mismatch between the "East Passive" and "West Passive" die pairs increases as the physical X, Y coordinate distance increases.

In an implementation, the desired DC gain of the SIP data acquisition device 200 is represented by G--(R3/(R1+R2)), where R1 is physically positioned on the west passive side and R2, R3 are physically positioned on the east passive side of the die. A single iPassive wafer may contain multiple single-die thin-film resistor networks, and to physically position the resistors on the west and east passive sides of the die, a single die can be sawn into two parts (west side and east side). After sawing, though, the neighboring dies may be mixed together, which may cause the east/west-side labels to be lost.

To avoid interconnecting mismatched pairs into the same SIP, in some embodiments, a unique ID is placed on each west/east-side die pair in the wafer fabrication process prior to sawing the wafer. In an implementation, this ID is related to the X and Y coordinate locations of the die pairs. In this way, a set of iPassive components designed to be physically located on east/west passive sides, respectively, of the same SIP module that are sawed from the same wafer can be identified and maintained. This avoids interconnecting pairs of iPassive components that are sawn from different wafers or from unexpected physical positions on a wafer.

The unique ID that is placed on the west and east sides of the die pair is configured to be read and detected optically in assembly prior to packaging the neighboring die pairs. In this way, the neighbouring pairs that were designed and manufactured to work in the same SIP module are selected for assembly together, which ensures optimal temperature tracking. In some circumstances, though, it may be desirable to confirm post-assembly that the correct pairs of iPassive devices were placed in the same SIP module. In such cases, reading the unique ID optically may require physical access to the ID of the wafer, which necessitates destructive de-capping or encapsulated plastic packaging. This task is cumbersome and consumes a great deal of time and resources, and may end up damaging the device.

In some embodiments, instead of or in addition to marking the east/west-side die pairs using a unique ID, the pairs are identified electrically. This process may involve laser trimming "redundant" non-signal current-carrying TFR (iPassive) devices with a series of ohm values that depend on the exact X and Y physical grid location of each die pair in the wafer. Specifically, the sum of the resistance in the x-axis (X$\Omega$) and the sum of the resistance in the y-axis (Y$\Omega$) of the physical device position on the wafer is configured to add up to a set resistance target only for unique neighboring pairs. For example, a physical node (ball) that enables measurement of a resistance using a probe may be provided for a given set of iPassive components on each die along the X and Y directions.

A probe may be connected to measure the resistance along the X direction between a pair of dies. If the probe determines that the resistance in the X direction matches a predetermined value (e.g., 30 k$\Omega$), the probe may determine that the pair of dies were cut from the same X direction or position. The probe may then be connected to measure the resistance along the Y direction between the same pair of dies. If the probe determines that the resistance in the Y direction matches a predetermined value (e.g., 30 k$\Omega$), which may be the same as the predetermined value in the X direction, the probe may determine that the pair of dies were cut from the same Y direction or position. If both the X and the Y resistances match the predetermined values, the probe (which may include a processor) determines that the pair of dies match. If the resistance in the X or the Y direction does not match the predetermined value, the assembled pair of dies are determined not to have originally been neighbors before the wafer was sawn.

Figure 8:
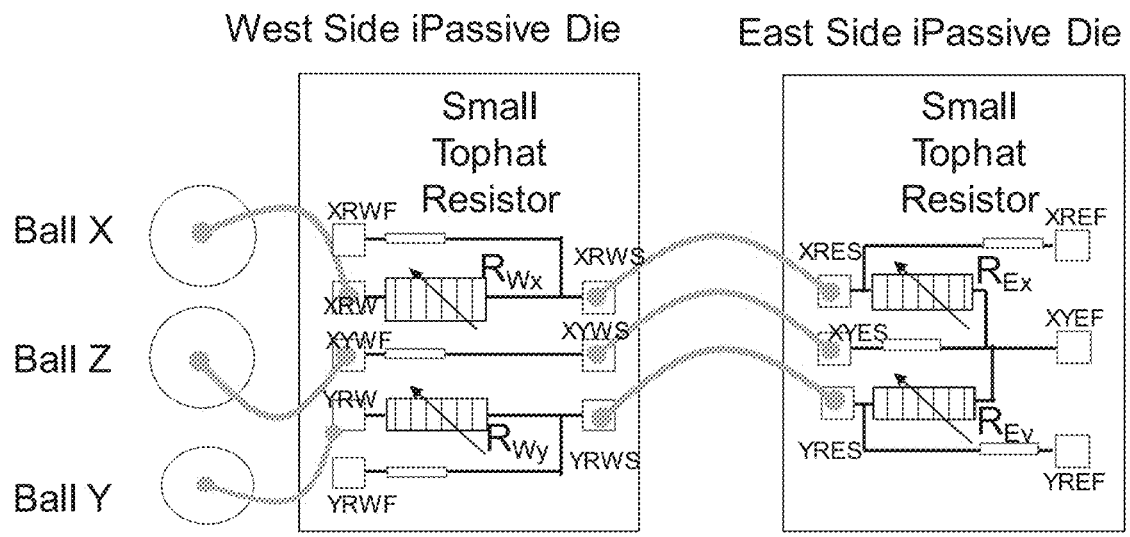
FIG. 8 shows an example of two dies in accordance with various embodiments.

FIG. 8 shows an example of two dies (east- and west-side dies) and balls used as nodes for measuring the resistance along the X, Y, and Z directions. The resistors along the X direction of the dies can be trimmed so that for any given pair of neighbors the sum of the resistances as measured between balls X and Z will be 30 k$\Omega$ if a neighboring pair is in that package. As one example, for the X-coordinate trim pair A, $R_{WxA}$=5 k$\Omega$ and $R_{ExA}$=25 k$\Omega$ for a total of 30 k$\Omega$; for pair B, $R_{WxB}$=15 k$\Omega$ and $R_{ExB}$=15 k$\Omega$ for a total of 30 k$\Omega$. Specifically, the probe measures a series resistance between the X-direction resistors of the west-side iPassive die and the X-direction resistors of the east-side iPassive die. If the sum of these measurements matches the predetermined amount (e.g., 30 k$\Omega$), the dies are determined to be a pair along the X direction. A similar measurement can be made using the Y-direction resistors of the two dies to determine if the measurement matches the predetermined amount. In an implementation, the total resistance for the Y trim is measured between Y and Z balls or nodes. If the measurements along the X and the Y directions both match the predetermined amounts, the dies are determined to be matched pairs. In this way, a probe can determine and confirm that the iPassive components used in a given SIP module correspond to matched pairs and were cut from the same wafer without having to read an optically placed unique identifier.

While the above discussion relates to dividing the wafer into two sides (east and west), any number of additional divisions can be made to provide multiple dies for assembly into the same SIP module. If, for example, three dies are placed on the same SIP module, a probe can detect if they are paired and matched by measuring total resistances along the X and Y directions of the three dies and comparing the total resistances along the X and Y directions to a threshold.

As discussed above, the desired DC gain of the SIP data acquisition device 200 is represented by G=−(R3/(R1+R2)). In some embodiments, to maximize the device's full-scale voltage range, to accommodate a multitude of input sensors of differing voltage characteristics and ranges, the inputs are attenuated. Specifically, the DC gain is configured to be G<1. To enable this functionality, the resistance R1+R2 is set to be greater than R3. In some embodiments, a phase reversal condition is removed through use of Schottky clamp diodes, which increases the dynamic range performance of the SIP data acquisition device 200. Through the use of integrated-passive components, custom sizing of diodes is possible with minimum impact of diode parasitic capacitance and p-n junction leakage currents on overall performance.

Figure 9:
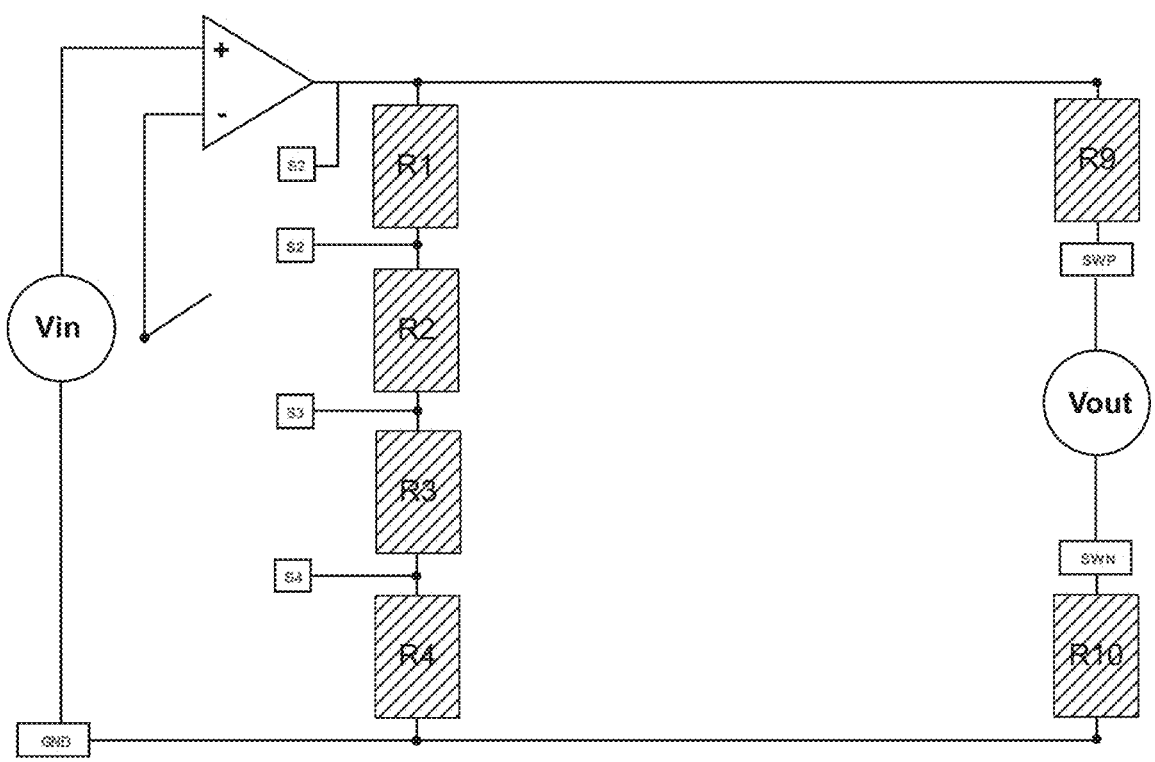
FIG. 9 shows a typical amplifier gain network.

With respect to the PGA 210, for iPassive resistor components, the interconnect resistance between each unit resistor may contribute to unwanted DC gain error. Individual resistors 214 coupled to the PGA 210 can be scaled decreasingly in size to provide greater control over the gain ranges of the PGA 210. The percent gain error from parasitic resistances may be most acute when the PGA 210 gain is the highest (e.g., gain G=1+(R1+R2+R3)/R4). A typical PGA gain network is shown in FIG. 9. To address this issue, the amount of interconnect resistance can be reduced by decreasing the number of resistor units, but this also results in higher current being passed through the remaining interconnects.

Figure 10:
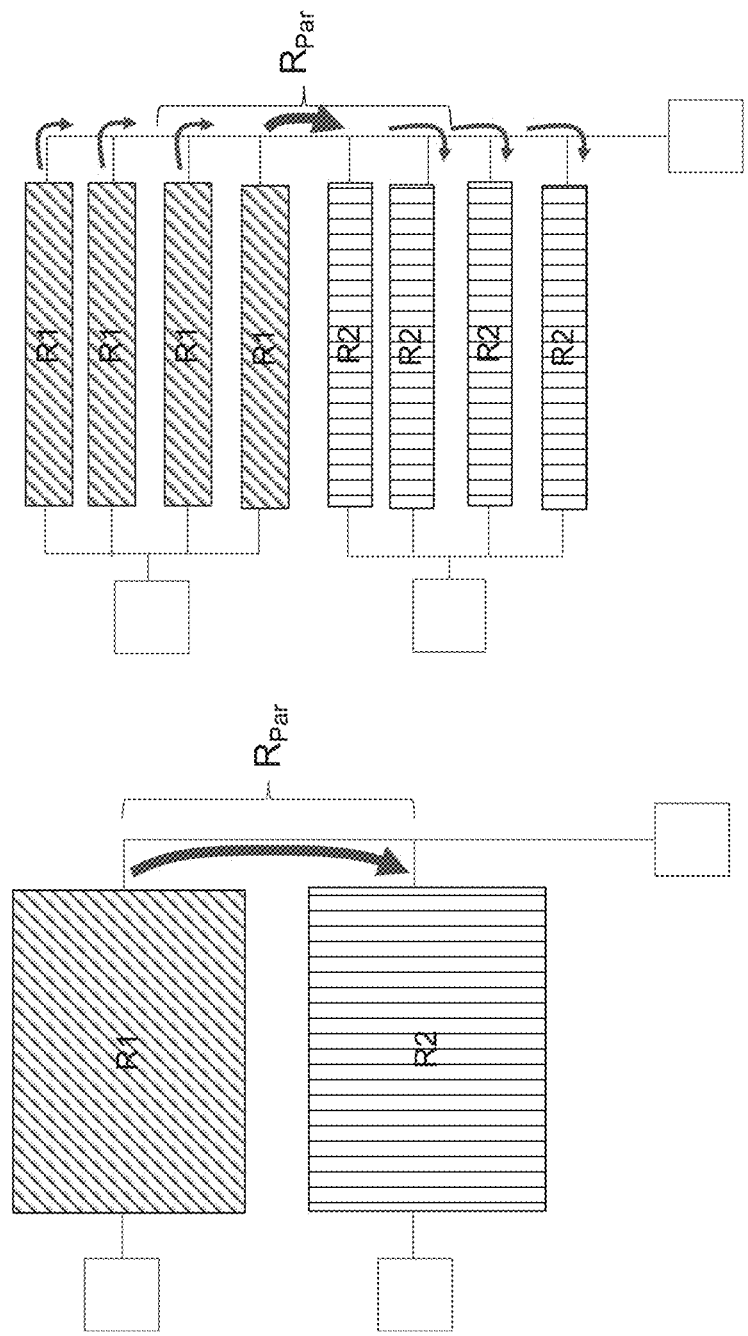
FIGS. 10-12 shows an illustrative arrangement of resistor blocks in accordance with various embodiments.
Figure 11:
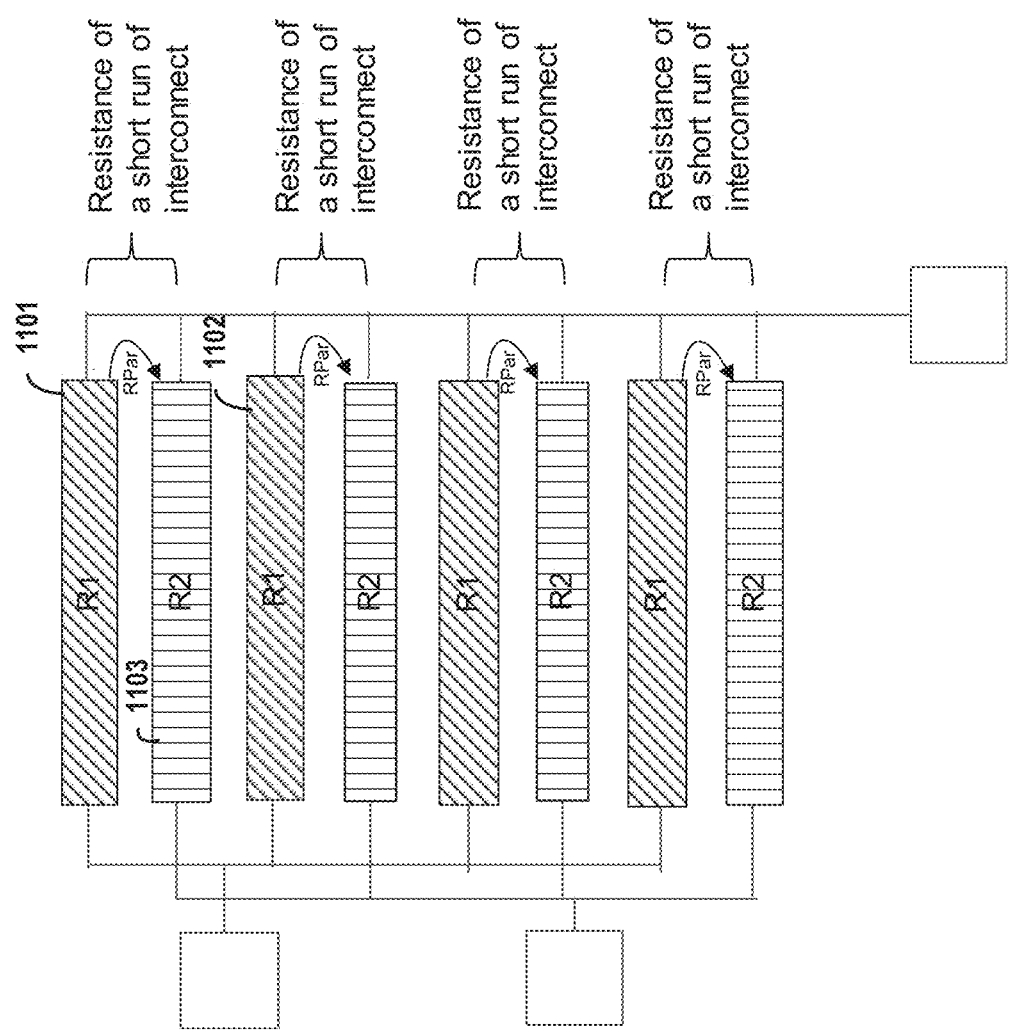

In some embodiments, rather than decreasing the number of resistor units, the number of resistor units is increased, as well as the number of interconnects. By connecting the resistors in parallel, the overall interconnect resistance $R_{Par}$ (which represents the resistance of a long run interconnect) can be reduced and the resistance of the additional interconnects can be adjusted for or offset by the resistance of the resistors. Taking just two resistors R1 and R2 as an example progressing through FIGS. 10-11 it can be observed that single resistors R1 and R2 (shown on the left side of FIG. 10) can be split up into multiple individual components (shown on the right side of FIG. 10) and then nested among each other (as shown in FIG. 11) to reduce the length of the interconnects between their individual components. Specifically, the components of each resistor R1 and R2 can be physically positioned closer to each other and between each other or a portion of the remaining components of resistor R1 and R2. Specifically, a first set of components 1101 of resistor R1 and a second set of components 1102 of resistor R1 are divided physically in the layout by a first set of components 1103 of R2 (e.g., the first set of components 1103 of R2 are physically positioned between the first and second sets of components 1101/1102 of R1). This reduces the length of the interconnects between the components 1101/1102/1103 of R1 and R2. In the embodiment drawn in FIG. 11, a network of multiple resistor arrangements of FIG. 10 are coupled in parallel which reduces the current in any individual metal interconnect and decreases the length of the interconnect runs resulting in a low overall resistance. These factors make the interconnect resistance Rpar very small and reduce the affect the interconnect resistance has on the gain error and gain drift.

Figure 12:
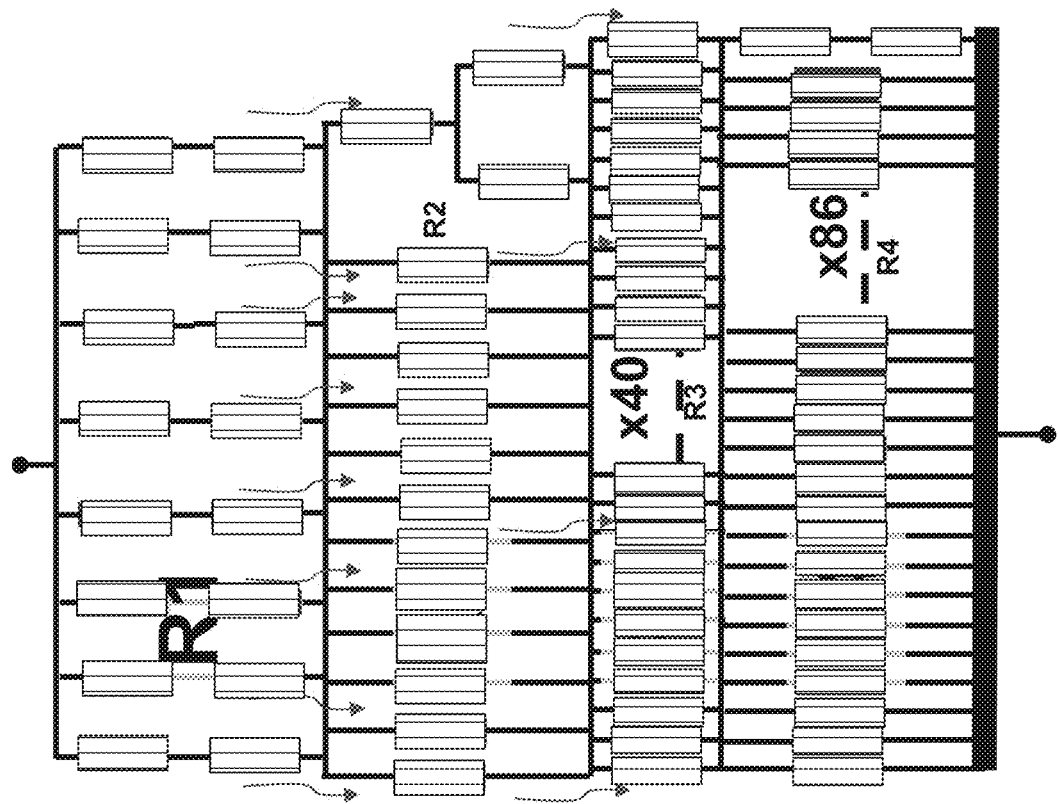

In a full embodiment of the PGA 210, the nesting of resistors is continued for all resistors (e.g., four resistors) in the PGA 210 with increasing numbers of elements being used to build the lower value resistors in the string. With this increase in the number of elements for the lower value resistors, the amount of paralleling of interconnect increases. This results in significant further reductions in the effective interconnect resistance (e.g., in the highest gain setting of PGA 210 output G=1+(R1+R2+R3)/R4). FIG. 12 shows schematically the resistor network of the PGA 210 where current transfer between neighbouring resistor elements is very direct contributing only low interconnect resistance which is reduced further by the fact that there are multiple resistors coupled in parallel.

In some embodiments, multiple resistor blocks (each containing one or more resistors coupled in series and in parallel) are provided. The resistor blocks can be configured such that a first plurality of resistors in a first block can be connected in series with a first plurality of resistors in a second block and in parallel with a second plurality of resistors in the second block. This provides greater control over the amount of resistance that is selected to be coupled to the PGA 210 and reduces the interconnect sizes between various resistors. Also, while more interconnects are used to connect the resistors between the blocks, the interconnects themselves are parallel to each other, which minimizes their overall impact on the resistance error and PGA 210 DC gain error. An illustrative arrangement of resistor blocks and the parallel current flow is shown in FIG. 9.

Referring back to FIG. 2, in some implementations, ESD clamps, input-protection devices, and/or supply coupling capacitors may be incorporated in the SIP data acquisition device 200 using integrated-passive devices, which further enhances the performance of the SIP data acquisition device 200 over traditional data acquisition devices. This is because implementing such circuitry in the SIP data acquisition device 200 instead of using discrete external components on a printed circuit board reduces resistance, capacitance, and inductance values caused by such circuitry.

In some implementations, the SIP data acquisition device 200 may implement one or more power supply regulators (not shown). These power supply regulators may set and provide immunity to power supply variations from external components and further increase the robustness of the SIP data acquisition device 200.

In some implementations, the SIP data acquisition device 200 may receive an input with up to 130 dB of dynamic range within a 90 kHz input bandwidth at 204.8 Ksps. The analog signal input may range from −10V to +10V. The SIP data acquisition device 200 may provide a digital output signal with 24-bit resolution (e.g., using a 24-bit or more ADC 230). The input impedance of the SIP data acquisition device 200 may be very high with a very low input bias current.

The PGA 210 of the SIP data acquisition device 200 may have any number of programmable gains. For example, the PGA 210 may include four programmable gain steps of 0 dB, 10 dB, 20 dB, and 30 dB. Any other suitable gain steps may be provided using different configurations of integrated-passive resistors. For example, the PGA 210 may include an amplifier 212 coupled to a feedback integrated-passive resistor network provided by the resistors 214. The resistors 214 may include a configurable or selectable resistor. This configurable or selectable resistor can be controlled by an external component (controller) through an input signal to the SIP data acquisition device 200. Based on the value selected for this selectable resistor, the amplification provided by the amplifier 212 may be changed and controlled by the external component.

The output of the PGA 210 may pass through the series of integrated-passive devices 240 for input to the filter 220. The filter 220 may be an anti-alias filter device. The values of resistors and capacitors provided in the SIP data acquisition device 200 may be selected at the time of device manufacture for ideal performance of one or more components in the SIP data acquisition device 200. For example, the values of the resistors 214 may be selected to be manufactured with the amplifier 212 on the SIP data acquisition device 200 based on internal performance characteristics of the amplifier 212 to provide ideal or close-to-ideal amplification of signals. Similarly, the values of the series of integrated-passive devices 240 may be selected to be manufactured with the filter 220 on the SIP data acquisition device 200 based on internal performance characteristics of the filter 220 to provide ideal or dose-to-ideal filtering of signals.

The output of the filter 220 may be passed through additional series of integrated-passive devices 240 for input to the ADC 230. The ADC 230 may implement a 24-bit digital-to-analog converter circuit. Any other suitably sized ADC 230 may be provided. The ADC 230 may generate a digital representation of the analog signal received from the pre-filter 250 for output to an external component (e.g., as the digital output 132).

The small footprint of the SIP data acquisition device 200 (e.g., 6 mm×12 mm) enables a large number of channels or sensor signal inputs to be placed on the same side of a printed circuit board, as well as the option to place channel inputs on the back side of the printed circuit board. This technologically improves typical systems by increasing and maximizing the available density of components on the printed circuit board. This enables the SIP data acquisition device 200 to be coupled to a mixture of sensor types (e.g., temperature sensors, wing sensors, bridge sensors, audio sensors) in a variety of applications in the presence of high common-mode signals.

Figure 3:
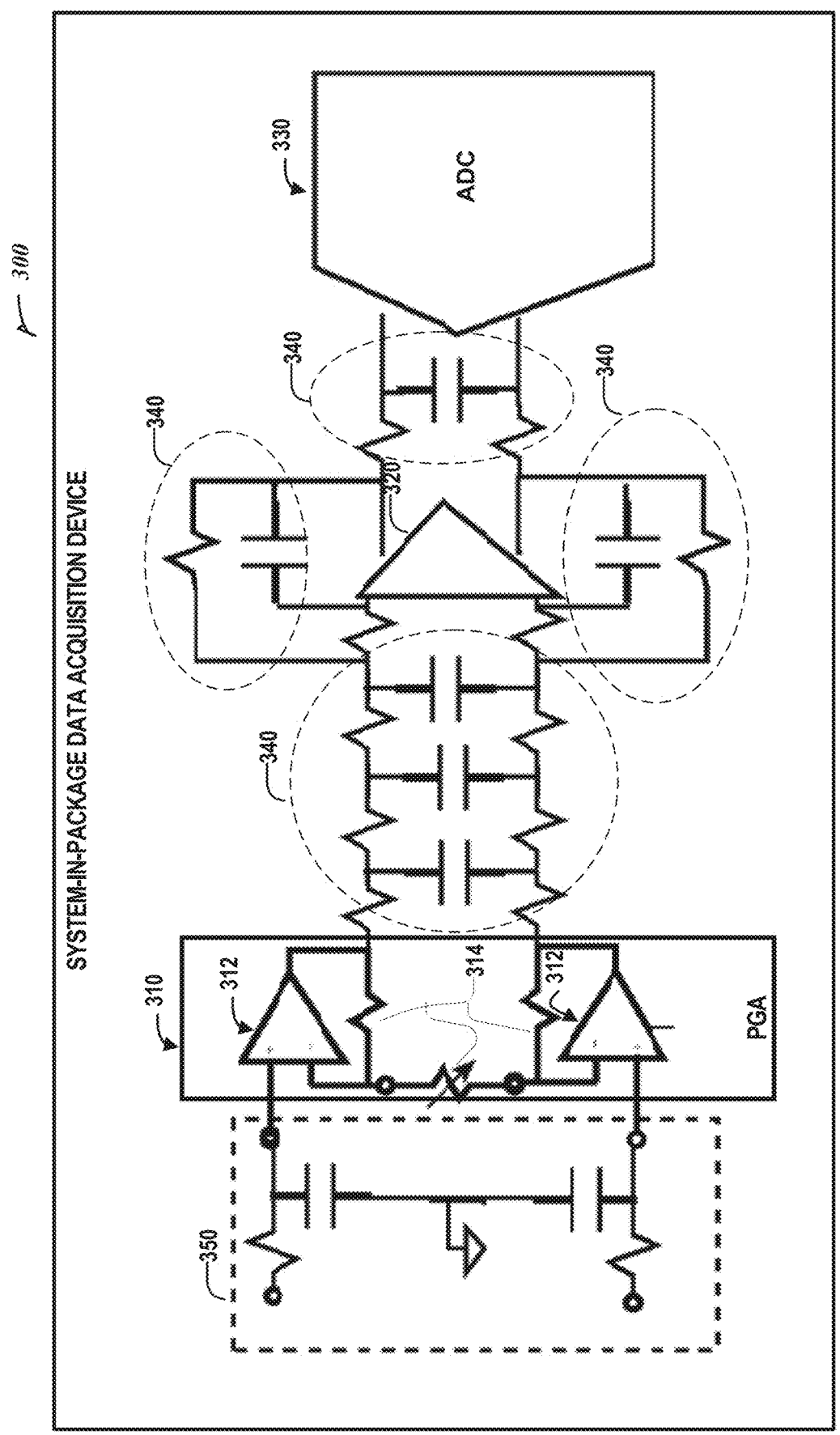
FIG. 3 is a block diagram of an example of a differential-input SIP data acquisition device in accordance with various embodiments.

FIG. 3 is a block diagram of an example of a differential-input SIP data acquisition device 300 in accordance with various embodiments. The SIP data acquisition device 300 includes some of the devices from the SIP data acquisition devices 100 and 200. For example, the SIP data acquisition device 300 includes a PGA 310, a filter 320, an ADC 330, a series of integrated-passive devices (resistors and capacitors) 340, and a pre-filter 350, all implemented on the same SIP. The PGA 310 may include some or all of the circuitry of the PGA 110, the filter 320 may include some or all of the circuitry of the filter 120, the ADC 330 may include some or all of the circuitry of the ADC 130, and the pre-filter 350 may include some or all of the circuitry of the pre-filter 140.

Similar to the components in the SIP data acquisition device 200, the components in the SIP data acquisition device 300 may be coupled together through a series of integrated-passive devices (resistors and capacitors) 340. These integrated-passive devices may be fabricated using standard wafer fabrication techniques, such as thin-film and photolithography processing. The substrates for the integrated-passive devices may be thin-film substrates like silicon, alumina, or glass. For example, the integrated-passive resistors may be manufactured from high-accuracy thin-film silicon chromium (SiCr). The integrated-passive capacitors may be manufactured as metal-insulator-metal (MIM) capacitors.

The pre-filter 350 may receive a differential analog signal, pre-filter the differential analog signal, and provide the pre-filtered differential analog signal to an input of the PGA 310. The pre-filter 350 may filter a signal using a series of integrated-passive devices (resistors and capacitors). The pre-filter 350 may implement a high-pass filter, low-pass filter, band-pass filter, or any other suitable filtering circuitry or combination thereof.

In some implementations, the SIP data acquisition device 300 may implement one or more power supply regulators (not shown). These power supply regulators may set and provide immunity to power supply variations from external components and further increase the robustness of the SIP data acquisition device 300.

In some implementations, the SIP data acquisition device 300 may receive a differential input with up to 130 dB of dynamic range. The differential analog signal input may range from −10V to +10V. The SIP data acquisition device 300 may provide a digital output signal with 24-bit resolution (e.g., using a 24-bit or more ADC 330). The input impedance of the SIP data acquisition device 300 may be very high with a very low input bias current.

The PGA 310 of the SIP data acquisition device 300 may have any number of programmable gains. For example, the PGA 310 may include four programmable gain steps of 0 dB, 10 dB, 20 dB, and 30 dB. Any other suitable gain steps may be provided using different configurations of integrated-passive resistors. For example, the PGA 310 may include first and second amplifiers 312 coupled to a feedback integrated-passive resistor network 314. The integrated-passive resistor network 314 may include one or more configurable or selectable resistors. The configurable or selectable resistors can be controlled by an external component (controller) through an input signal to the SIP data acquisition device 300. Based on the value selected for the selectable resistors, the amplification provided by the first and second amplifiers 312 may be changed and controlled by the external component.

The output of the PGA 310 may pass through the series of integrated-passive devices 340 for input to the filter 320. The filter 320 may be an anti-alias filter device. The values of resistors and capacitors provided in the SIP data acquisition device 300 may be selected at the time of device manufacture for ideal performance of one or more components in the SIP data acquisition device 300. For example, the values of resistors in the integrated-passive resistor network 314 may be selected to be manufactured with the first and second amplifiers 312 on the SIP data acquisition device 300 based on internal performance characteristics of the first and second amplifiers 312 to provide ideal or close-to-ideal amplification of signals. Similarly, the values of the series of integrated-passive devices 340 may be selected to be manufactured with the filter 320 on the SIP data acquisition device 300 based on internal performance characteristics of the filter 320 to provide ideal or close-to-ideal filtering of signals.

The output of the filter 320 may be passed through additional series of integrated-passive devices 340 for input to the ADC 330. The ADC 330 may implement a 24-bit digital-to-analog converter circuit. Any other suitably sized ADC 330 may be provided. The ADC 330 may generate a digital representation of the analog signal received from an external component (e.g., one or more sensors) and provide it to an external component (e.g., as the digital output 132). The digital representation of the ADC 330 may be single-ended or differential depending on the type of input signal received by the SIP data acquisition device 300.

The small footprint of the SIP data acquisition device 300 (e.g., 6 mm×12 mm) enables a large number of channels or sensor signal inputs to be placed on the same side of a printed circuit board, as well as the option to place channel inputs on the back side of the printed circuit board. This technologically improves typical systems by increasing and maximizing the available density of components on the printed circuit board. This enables the SIP data acquisition device 300 to be coupled to a mixture of sensor types (e.g., temperature sensors, wing sensors, bridge sensors, audio sensors) a variety of applications in the presence of high common-mode signals.

In some embodiments, the SIP data acquisition device 300 may receive a single input signal rather than a differential input signal. In such circumstances, the second amplifier 312 of the PGA 310 may be disabled. In some embodiments, the pre-filter 350 may be disabled or not used by the SIP data acquisition device 300. For example, an external component (e.g., a controller) may provide a control signal that disables the pre-filter 350. In such circumstances, the analog input signal may be routed directly to the PGA 310 and avoid passing through the pre-filter 350. For example, the PGA 310 may be coupled to receive an analog input signal via a multiplexor (not shown). The multiplexor may be coupled to receive the analog input signal (e.g., the signal 112) directly and may be coupled to receive in parallel an output signal of the pre-filter 350. The select line of this multiplexor (controlled by an externally supplied input signal to the SIP data acquisition device 300) may control which of the two analog input signals of the multiplexor to provide as output to the PGA 310.

Figure 4:
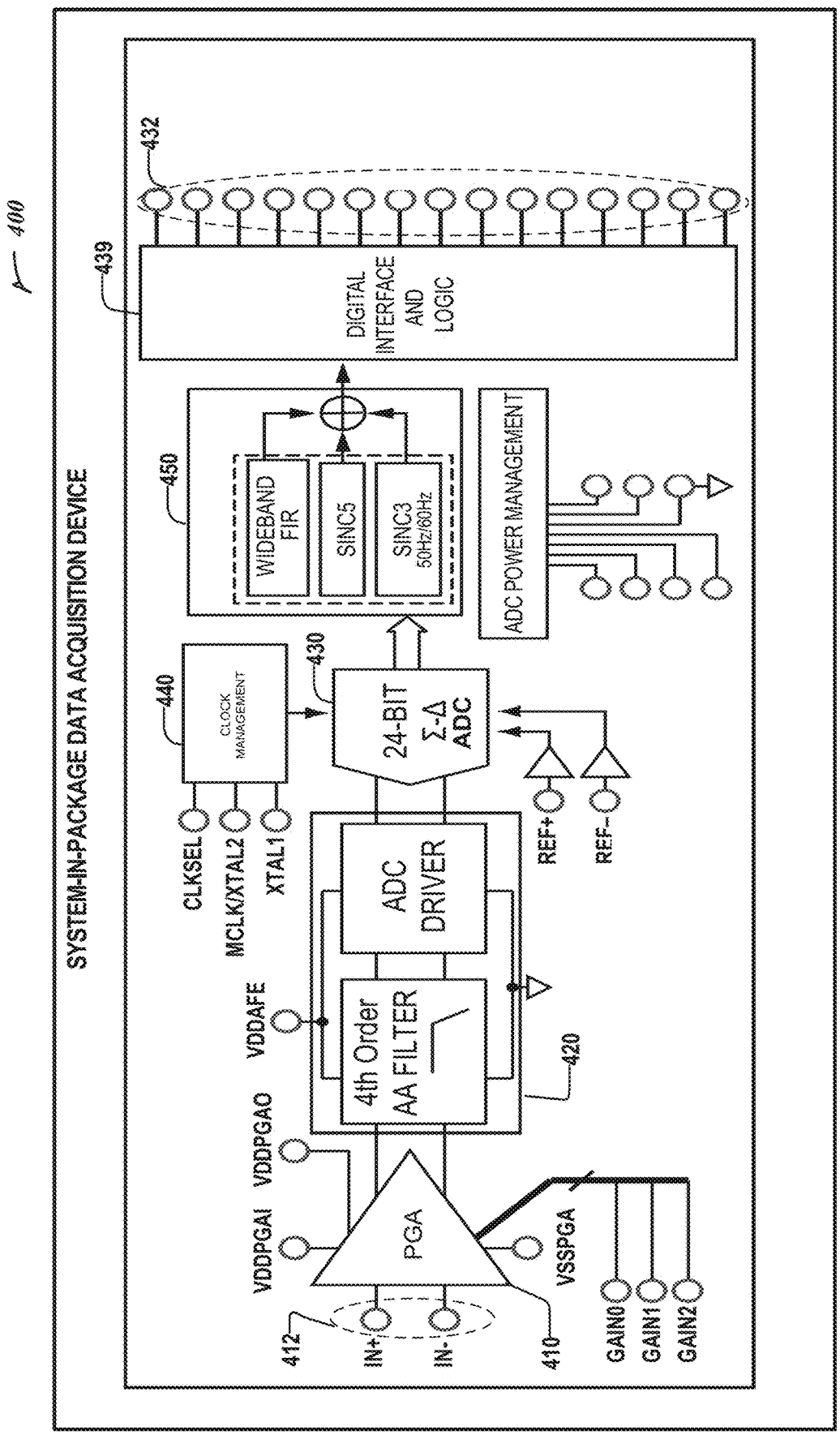
FIG. 4 is a block diagram of an example of a differential-input SIP data acquisition device in accordance with various embodiments.

FIG. 4 is a block diagram of an example of a differential-input SIP data acquisition device 400 in accordance with various embodiments. The SIP data acquisition device 400 includes a PGA 410, a filter 420, an ADC 430, clock management circuitry 440, a digital filter 450, and a digital interface and logic 439, all implemented on the same system-in-package device.

The PGA 410 may implement the same functionality as the PGA 110. In particular, the PGA 410 receives differential analog input signals 412 and a set of programmable gain selection inputs (GAIN0-2). Any number of select signals may be provided depending on the range of selectable gains of the PGA 410 or the size of the multiplexor that controls the gain of the PGA 410. Based on the values of the programmable gain selection inputs (provided by an external component), the PGA 410 applies a particular selected gain to the analog input signals 412.

The output of the PGA 410 is provided to the filter 420. The filter 420 may implement the same functionality as the filter 120. In particular, the filter 420 may include a fourth-order anti-alias filter and an analog-to-digital converter driver circuit. The filter 420 conditions the amplified analog signal for input to the ADC 430.

The ADC 430 receives the conditioned and filtered analog signal from the filter 420. The clock management circuitry 440 provides a suitable clock signal for the ADC 430 to perform analog-to-digital conversion. The clock frequency of the clock management circuitry 440 may be externally controlled (e.g., using a clocksel signal provided by an external component). The clock management circuitry 440 may also receive one or more oscillator inputs from an external component to perform phase/frequency matching using an internal PLL corresponding to the analog input signal. The ADC 430 may implement a 24-bit analog-to-digital converter circuit (e.g., a delta-sigma ADC circuit).

The digital representation generated by the ADC 430 may be provided to the digital filter 450. The digital filter 450 may be externally controlled (by an external component) to apply one or more digital filters to the digitized analog signal generated by the ADC 430. For example, the digital filter 450 may be configured to apply a wideband finite impulse response filter, a sinc5 filter, a sinc3 filter, or any other suitable digital filter technique. The output of the digital filter 450 may be provided to the digital interface and logic 439. A set of outputs 432 may be provided by the digital interface and logic 439 to an external component (e.g., a controller or processor). Each output 432 may include a different digitized signal corresponding respectively to a given sensor input or inputs.

In some implementations, the SIP data acquisition device 400 may implement, on the same SIP, a power management component with a set of power supply regulators. The power management component may supply power to one or more other components in the SIP data acquisition device 400. The power management component may be externally controlled to provide different power values to the ADC 430. This power management component may set and provide immunity to power supply variations from external components and further increases the robustness of the SIP data acquisition device 400.

Figure 5:
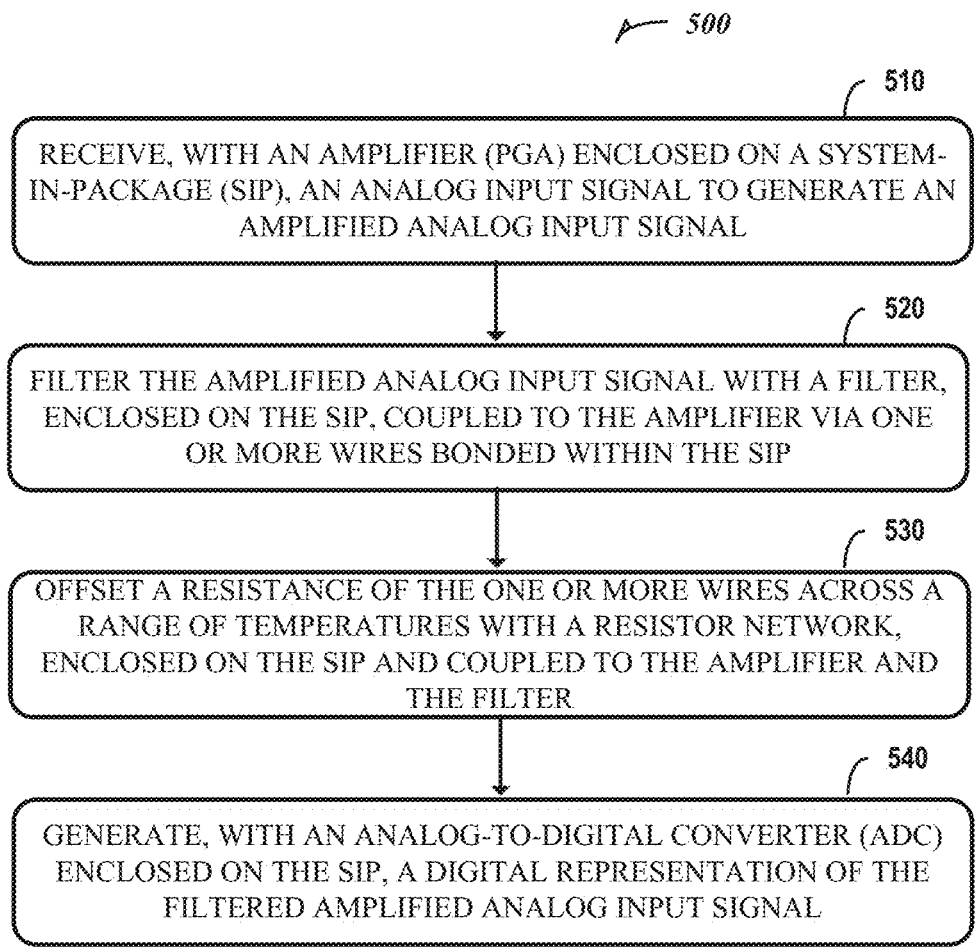
FIG. 5 is a flow diagram depicting an example process for performing data acquisition with a SIP in accordance with various embodiments.

FIG. 5 is a flow diagram depicting an example process 500 for performing data acquisition with a SIP in accordance with various embodiments. At operation 510, an analog input signal is received, with an amplifier (PGA) enclosed on a system-in-package (SIP), to generate an amplified analog input signal. For example, the PGA 110 receives the single input or differential input signal 112.

At operation 520, the amplified analog input signal is filtered with a filter, enclosed on the SIP, coupled to the amplifier via one or more wires bonded within the SIP. For example, the filter 120 receives from the PGA 110 the amplified analog signal and may filter the amplified analog signal to condition the signal for analog-to-digital conversion.

At operation 530, a resistance of the one or more wires across a range of temperatures is offset with a resistor network enclosed on the SIP and coupled to the amplifier and the filter.

At operation 540, a digital representation of the filtered amplified analog input signal is generated, with an analog-to-digital converter (ADC) enclosed on the SIP. For example, the ADC 130 receives the filtered amplified analog signal from the filter 120 and generates a digital representation of the signal for output as the digital output 132.

Figure 6:
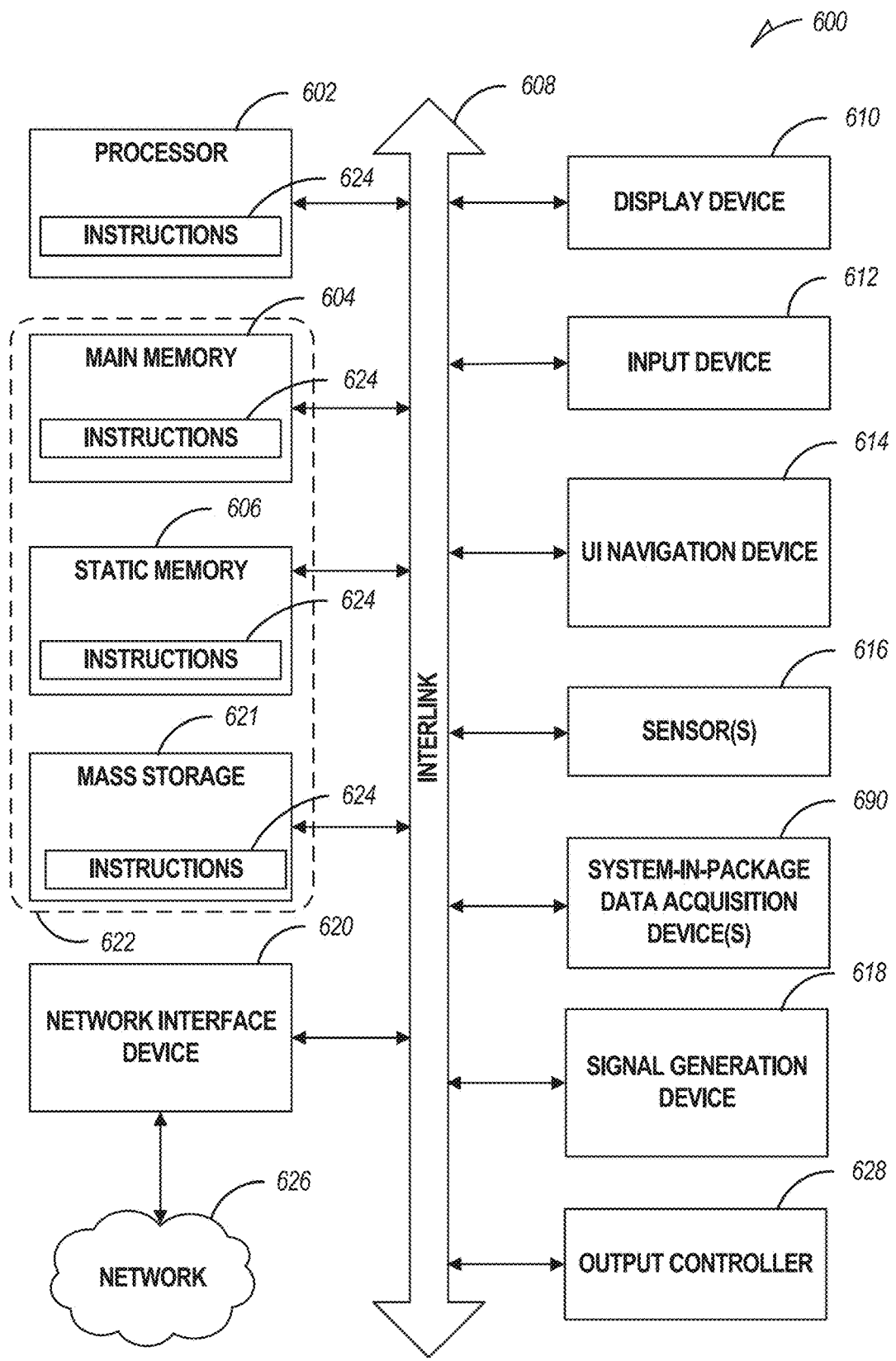
FIG. 6 is a block diagram illustrating an example of a machine upon which one or more embodiments may be implemented.

FIG. 6 illustrates a block diagram of an example machine 600 upon which any one or more of the techniques (e.g., methodologies) discussed herein may perform. In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in a peer-to-peer (P2P) (or other distributed) network environment. The machine 600 may be a personal computer (PC), a tablet PC, a set-top box (STB), a personal digital assistant (PDA), a mobile telephone, a web appliance, an IoT device, an automotive system, an aerospace system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by movable placement of invariant-massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 600 may include a hardware processor 602 (e.g., a central processing unit (CPU), a graphics processing unit (GPU), a hardware processor core, or any combination thereof), a main memory 604, and a static memory 606, some or all of which may communicate with each other via an interlink (e.g., bus) 608. The machine 600 may further include a display unit 610, an alphanumeric input device 612 (e.g., a keyboard), and a user interface (UI) navigation device 614 (e.g., a mouse). In an example, the display unit 610, input device 612, and UI navigation device 614 may be a touch screen display. The machine 600 may additionally include a storage device (e.g., drive unit); a signal generation device 618 (e.g., a speaker); a network interface device 620; one or more sensors 616, such as a global positioning system (GPS) sensor, wing sensors, mechanical device sensors, temperature sensors, ICP sensors, bridge sensors, audio sensors, industrial sensors, compasses, accelerometers, or other sensors; and one or more system-in-package data acquisition devices 690. The system-in-package data acquisition device(s) 690 may implement some or all of the functionality of the system-in-package data acquisition device 100. The machine 600 may include an output controller 628, such as a serial (e.g., universal serial bus (USB)), parallel, or other wired or wireless (e.g., infrared (IR), near field communication (NFC), etc.) connection to communicate with or control one or more peripheral devices (e.g., a printer, card reader, etc.).

The storage device may include a machine-readable medium 622 on which is stored one or more sets of data structures or instructions 624 (e.g., software) embodying or utilized by any one or more of the techniques or functions described herein. The instructions 624 may also reside, completely or at least partially, within the main memory 604, within the static memory 606, or within the hardware processor 602 during execution thereof by the machine 600. In an example, one or any combination of the hardware processor 602, the main memory 604, the static memory 606, or the storage device 621 may constitute the machine-readable medium 622.

While the machine-readable medium 622 is illustrated as a single medium, the term "machine-readable medium" may include a single medium or multiple media (e.g., a centralized or distributed database, or associated caches and servers) configured to store the one or more instructions 624.

The term "machine-readable medium" may include any transitory or non-transitory medium that is capable of storing, encoding, or carrying transitory or non-transitory instructions for execution by the machine 600 and that cause the machine 600 to perform any one or more of the techniques of the present disclosure, or that is capable of storing, encoding, or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory EEPROM)) and flash memory devices; magnetic disks, such as internal hard disks and removable disks; magneto-optical disks; and CD-ROM and DVD-ROM disks.

The instructions 624 (e.g., software, programs, an operating system (OS), etc.) or other data are stored on the storage device 621, and can be accessed by the main memory 604 for use by the hardware processor 602. The main memory 604 (e.g., DRAM) is typically fast, but volatile, and thus a different type of storage than the storage device 621 (e.g., an SSD), which is suitable for long-term storage, including while in an "off" condition. The instructions 624 or data in use by a user or the machine 600 are typically loaded in the main memory 604 for use by the hardware processor 602. When the main memory 604 is full, virtual space from the storage device 621 can be allocated to supplement the main memory 604; however, because the storage device 621 is typically slower than the main memory 604, and write speeds are typically at least twice as slow as read speeds, use of virtual memory can greatly reduce user experience due to storage device latency (in contrast to the main memory 604, e.g., DRAM). Further, use of the storage device 621 for virtual memory can greatly reduce the usable lifespan of the storage device 621.

The instructions 624 may further be transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone Service (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards networks, and peer-to-peer (P2P) networks, among others. In an example, the network interface device 620 may include one or more physical jacks (e.g., Ethernet, coaxial, or phone jacks) or one or more antennas to connect to the communications network 626. In an example, the network interface device 620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible or intangible medium that is capable of storing, encoding, or carrying instructions for execution by the machine 600, and includes digital or analog communications signals or other tangible or intangible media to facilitate communication of such software.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the inventive subject matter may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended; that is, a system, device, article, composition, formulation, or process that includes elements in addition to those listed after such a term in a claim is still deemed to fall within the scope of that claim. Moreover, in the following claims, the terms "first," "second," "third," etc. are used merely as labels, and are not intended to impose numerical requirements on their objects.

Method examples described herein may be machine- or computer-implemented at least in part. Some examples may include a computer-readable medium or machine-readable medium encoded with transitory or non-transitory instructions operable to configure an electronic device to perform methods as described in the above examples. An implementation of such methods may include code, such as microcode, assembly language code, a higher-level language code, or the like. Such code may include transitory or non-transitory computer-readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random-access memories (RAMS), read-only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the inventive subject matter should be determined with reference to the appended claims, along with the full scope of equivalents to which such claims are entitled.

What is claimed is:

1. A data acquisition system-in-package (SIP) assembly, the SIP comprising:
  an amplifier, enclosed on the SIP, configured to receive an analog input signal and to generate an amplified analog input signal; and
  a resistor network, enclosed on the SIP and coupled to the amplifier, comprising first and second resistor components, wherein:
  the first resistor component is partitioned into a first plurality of individual resistor components;
  the second resistor component is partitioned into a second plurality of individual resistor components; and
  the first plurality of individual resistor components is nested among the second plurality of individual resistor components, wherein a first individual resistor component of the second plurality of individual resistor components is physically located between a second individual resistor component of the first plurality of individual resistor components and a third individual resistor component of the first plurality of individual resistor components.

2. The SIP of claim 1, further comprising:
  a filter, enclosed on the SIP, configured to filter the amplified analog input signal, the filter being coupled to the amplifier via one or more wires bonded within the SIP, wherein the resistor network is configured to compensate for a resistance of the one or more wires.

3. The SIP of claim 1, wherein the SIP is a land grid array (LGA), a ball grid array (BGA), or a pin grid array (PGA) package.

4. The SIP of claim 1, wherein the first plurality of individual resistor components is configured in parallel with the second plurality of individual resistor components.

5. The SIP of claim 1, wherein the resistor network comprises a third plurality of individual resistor components, wherein the third plurality of individual resistor components is configured in parallel with a first set of individual resistors of the first plurality of individual resistor components, and wherein the third plurality of individual resistor components is configured in series with a second set of individual resistors of the first plurality of individual resistor components.

6. The SIP of claim 1, wherein the resistor network comprises integrated passive components that include at least one of a thin-film resistor network or a capacitor network.

7. The SIP of claim 1, wherein the amplifier is implemented on a die comprising a first material of a set of materials and at least another amplifier implemented on the SIP is implemented on a die comprising a second material of the set of materials.

8. The SIP of claim 7, wherein the set of materials comprises at least two of low-voltage MOS, high-voltage MOS, low-voltage DMOS, high-voltage DMOS, low-voltage bipolar, high-voltage bipolar, high-speed bipolar, BiCMOS, JFET, silicon germanium, silicon carbide, gallium nitride, gallium arsenide, gallium nitride on silicon carbide, gallium nitride on silicon, or semiconductor on insulator.

9. A method for using a system-in-package (SIP) assembly, the method comprising:
  receiving, with an amplifier enclosed on the SIP, an analog input signal to generate an amplified analog input signal;
  offsetting a resistance of one or more wires coupled to the amplifier with a resistor network, the resistor network comprising first and second plurality of individual resistor components enclosed on the SIP and coupled to the amplifier, wherein the first plurality of individual resistor components is nested among the second plurality of individual resistor components; and
  generating, with an analog-to-digital converter (ADC) enclosed on the SIP, a digital representation of the amplified analog input signal.

10. The method of claim 9, wherein a first individual resistor component of the second plurality of individual resistor components is physically located between a second individual resistor component of the first plurality of individual resistor components and a third individual resistor component of the first plurality of individual resistor components.

11. The method of claim 9, wherein the first plurality of individual resistor components is configured in parallel with the second plurality of individual resistor components.

12. The method of claim 9, wherein the SIP includes a third plurality of individual resistor components.

13. The method of claim 12, wherein a sum of a resistance value of the third plurality of individual resistor components is smaller than a sum of a resistance value of the first plurality of individual resistor components, and wherein the sum of the resistance value of the third plurality of individual resistor components is smaller than a sum of a resistance value of the second plurality of individual resistor components.

14. The method of claim 13, wherein a quantity of individual resistor components in the third plurality of individual resistor is larger than a quantity of individual resistor components in the first and second plurality of individual resistor components.

15. The method of claim 12, wherein the third plurality of individual resistor components is configured in parallel with the first and second plurality of individual resistor components.

16. The method of claim 12, wherein the third plurality of individual resistor components is configured in series with the first and second plurality of individual resistor components, and wherein the first and second plurality of individual resistor components are configured in parallel.

17. A method for configuring a system-in-package (SIP) assembly, the method comprising:
  identifying first and second resistor components of a resistor network enclosed on the SIP and coupled to an amplifier enclosed on the SIP, the amplifier configured to receive an analog input signal and to generate an amplified analog input signal, wherein the SIP is a land grid array (LGA), a ball grid array (BGA), or a pin grid array (PGA) package;
  partitioning the first resistor component into a first plurality of individual resistor components;
  partitioning the second resistor component into a second plurality of individual resistor components; and
  nesting the first plurality of individual resistor components among the second plurality of individual resistor components.

18. The method of claim 17, further comprising compensating for a resistance of one or more wires bonded within the SIP with the resistor network.

19. The method of claim 17, wherein nesting comprises physically placing a first individual resistor component of the second plurality of individual resistor components between a second individual resistor component of the first plurality of individual resistor components and a third individual resistor component of the first plurality of individual resistor components.

* * * * *